United States Patent [19]

Akaogi et al.

[11] Patent Number: 5,701,274
[45] Date of Patent: Dec. 23, 1997

[54] SEMICONDUCTOR DEVICE WITH SELECTABLE DEVICE INFORMATION

[75] Inventors: Takao Akaogi; Masanobu Yoshida, both of Kawasaki, Japan

[73] Assignee: Fujitsu Limited, Kawasaki, Japan

[21] Appl. No.: 466,665

[22] Filed: Jun. 6, 1995

Related U.S. Application Data

[63] Continuation of Ser. No. 155,143, Nov. 22, 1993, abandoned.

[30] Foreign Application Priority Data

Dec. 4, 1992 [JP] Japan .................................. 4-325578

[51] Int. Cl.$^6$ .................................................. G11C 8/00
[52] U.S. Cl. ................ 365/230.01; 365/96; 365/189.01; 365/200; 365/225.7
[58] Field of Search ........................ 365/230.01, 184, 365/185, 189.01, 200, 225.7, 96, 230.06, 230.08, 104

[56] References Cited

U.S. PATENT DOCUMENTS

| 4,816,757 | 3/1989 | Hutchins | 365/189.09 |
| 4,998,223 | 3/1991 | Akaogi | 365/185 |
| 5,280,451 | 1/1994 | Akaogi | 365/185 |
| 5,325,323 | 6/1994 | Nizaka | 365/96 |

*Primary Examiner*—Tan T. Nguyen
*Attorney, Agent, or Firm*—Armstrong, Westerman, Hattori, McLeland & Naughton

[57] ABSTRACT

A semiconductor device has a function of reading device information specific to the device as and when required. The semiconductor device has storage units for storing plural pieces of device information and a selector for selecting a predetermined one of the information pieces stored in the storage units when a device information read mode is set, so that the read information may match device data such as a manufacturer name and part name printed on the semiconductor device.

21 Claims, 9 Drawing Sheets

5,701,274

1

SEMICONDUCTOR DEVICE WITH SELECTABLE DEVICE INFORMATION

This application is a continuation of application Ser. No. 08/155,143 filed Nov. 22, 1993, now abandoned.

BACKGROUND OF THE INVENTION

1. Field of the Invention

The present invention relates to a semiconductor device, and particularly, to a semiconductor device with selectable device information.

2. Description of the Related Art

Nonvolatile semiconductor memories such as EPROMs, EEPROMs, and Flash memories (PROMs) contain device information such as device identification code and manufacturer code. These codes are called signatures. Generally, PROMs are programmed by PROM programmers, and the programming condition is unique (different) for each device. For the convenience, each PROM has device information so that every PROMs may automatically set programming conditions. The manufacturer code is allocated for individual manufacturers according to JEDEC (Joint Electron Device Engineering Council) specifications. The device code is freely used by manufacturers.

PROMs are frequently produced by OEMs (Original Equipment Manufacturers) and joint manufacturers, and therefore, even the same semiconductor chips are sometimes marketed under different manufacturer names. Namely, information such as part names printed on marketed semiconductor products are not always identical to manufacturer code and device code stored in the products. This results in confusing the market and users.

SUMMARY OF THE INVENTION

An object of the present invention is to provide a semiconductor device which will allow the proper information such as manufacturer, part name, and the like, which are information to be read out thereof according to printed thereon even if the semiconductor device is marketed under a different manufacturer's name.

According to the present invention, there is provided a semiconductor device having a function of reading device information specific to the device as and when required, wherein the semiconductor device comprises a storage unit for storing plural pieces of device information, and a selection unit for selecting a predetermined one of the information pieces stored in the storage unit when a device information read mode is set, so that the selected and read device information is matched with device data (device information) indicating the semiconductor device.

The selection unit may select one of the information pieces according to at least one bonding wire. The bonding wire may be optionally prepared in an assembling step of assembling the semiconductor device.

The selection unit may select one of the information pieces by use of at least one fuse. The fuse may be cut by using a laser beam in a wafer testing step of testing a wafer. Further, the fuse may be cut by applying a voltage between predetermined pins of the semiconductor device in a wafer sorting step or in a final testing step of testing a semiconductor product. The selection unit may select one of the information pieces by use of at least one nonvolatile memory transistor.

The selection unit may select one of the information pieces according to at least one mask on a master slice in a wafer fabricating step. The mask is used as the last mask in the wafer fabricating step.

The semiconductor device may be a nonvolatile semiconductor memory, and the storage unit is a part of a memory cell array in the nonvolatile semiconductor memory. The nonvolatile semiconductor memory may have first memory cell arrays, first decoder for selecting bit and word lines connected to the first memory cell arrays, a storage unit involving second memory cell arrays for storing the device information pieces, and a second decoder for selecting one word line connected to the second memory cell arrays when the device information read mode is set.

The device information may include manufacturer code and device code. The semiconductor device may further comprise a high-voltage detector serving as an information read mode setting unit that sets the information read mode only when a voltage higher than a normal source voltage is externally provided. The device data indicating the semiconductor device may include a manufacturer logo, and a part name.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

For a better understanding of the preferred embodiments of the present invention, a prior art and the problems thereof will be explained with reference to FIGS. 1 and 2.

Figure 1:
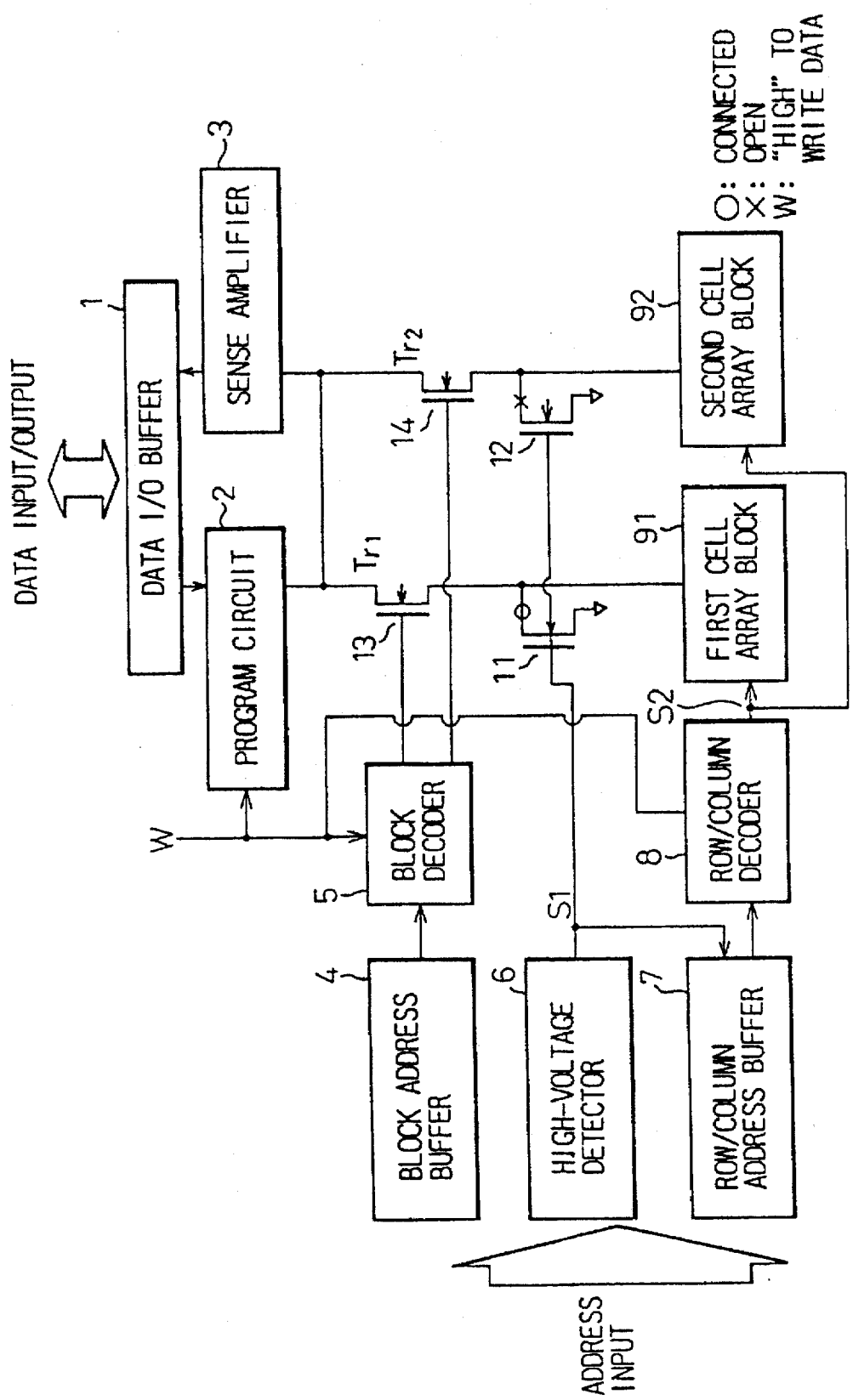
FIG. 1 shows a nonvolatile semiconductor memory according to a prior art.

FIG. 1 shows a nonvolatile semiconductor memory according to the prior art. The memory has a data I/O buffer 1, a programming circuit 2, a sense amplifier 3, a block address buffer 4, a block decoder 5, a high-voltage detector 6, a row/column address buffer 7, a row/column decoder 8, first and second cell array blocks 91 and 92, ROM cells 11 and 12, and gate transistors 13 and 14. A program control signal W becomes HIGH when programming data.

One of the first and second cell array blocks 91 and 92 is selected through the gate transistors 13 and 14 in response to a signal from the block decoder 5. The cell array blocks 91 and 92 are connected to the gate transistors 13 and 14, respectively, through bus lines, which are connected to the ROM cells 11 and 12.

The ROM cells 11 and 12 are used to store a signature involving manufacturer and device codes. The signature is programmed in the ROM cells 11 and 12 during a wafer fabricating step. For example, data "1" is programmed in the ROM cell 11 by connecting the drain thereof to the bus line, and data "0" is programmed in the ROM cell 12 by disconnecting the drain thereof from the bus line. In this way, the signature, i.e., device information involving manufacturer and device codes is programmed in the ROM cells 11 and 12. In practice, the signature is composed of, for example, two bytes.

In a normal operation of the nonvolatile semiconductor memory of FIG. 1, the row/column decoder 8 provides a cell selection signal S2 to simultaneously select a cell in each of the first and second cell array blocks 91 and 92. The block decoder 5 chooses one of the selected cells and connects it to the sense amplifier 3 to read data out of the chosen cell.

When reading the signature out of the ROM cells 11 and 12, a high-voltage signal is externally supplied. The high-voltage detector 6 detects the high-voltage signal and provides a high-voltage detection signal S1 of level HIGH to the gates of the ROM cells 11 and 12. The signal S1 is also supplied to the row/column address buffer 7, to make the row/column decoder 8 unselected. As a result, data stored in the ROM cells 11 and 12 are read, similar to the normal read operation.

Generally, a signature is made of two bytes, one for a manufacturer code and the other for a device code representing the identity of the part. For example, a flash memory has a signature involving a specific manufacturer code allocated for the manufacturer of the memory according to the JEDEC specifications and a device code freely used by the manufacturer. The manufacturer code may be "#04" representing "α" company, and the device code may be "#8F" representing a flash memory of duel power supply one megabit with byte wide. Note that the device information (device data) indicating, or representing, the semiconductor device is not only printed on the device, but the device information may be formed on the device by using an etching method or a laser beam. Further, the device information may be only printed on a box (package) which is used only to package the semiconductor device in the market.

As explained above, same nonvolatile semiconductor memories (chips) are sometimes marketed under different manufacturer and device codes due to different OEMs.

Figure 2:
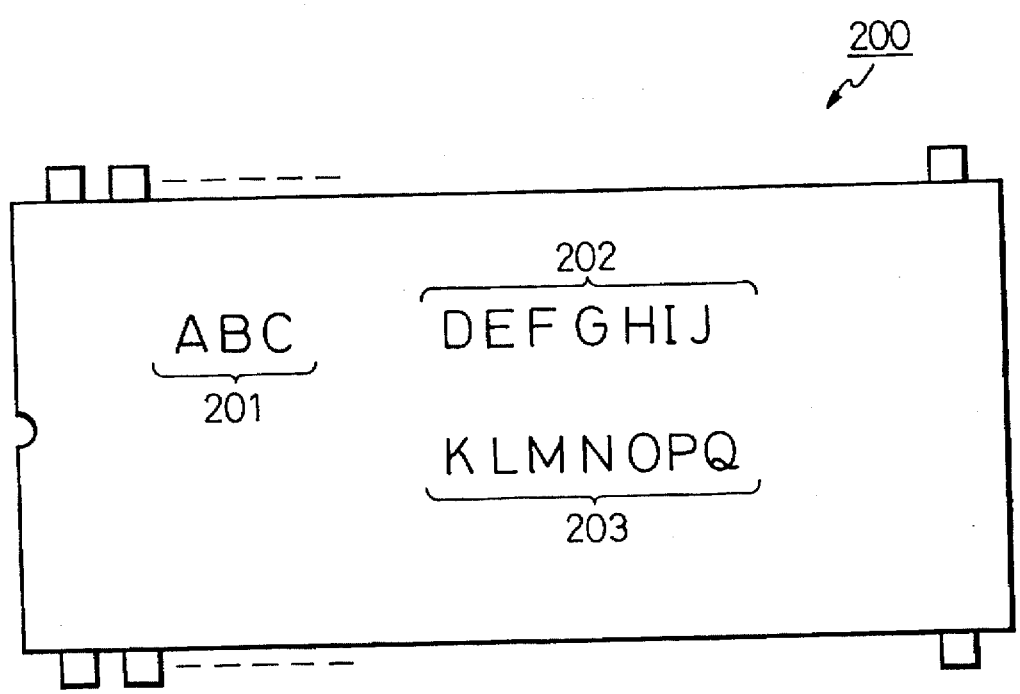
FIG. 2 shows an example of device information printed on a semiconductor device product.

FIG. 2 shows an example of a semiconductor device product 200. Manufacturer and device codes are printed on the surface of the package of the product 200.

The semiconductor device 200 has a manufacturer logo "ABC" indicated with reference numeral 201, a part name "DEFGHIJ" indicated with reference numeral 202, and a serial number "KLMNOPQ" indicated with reference numeral 203. The part name 202 may involve a speed version, etc., and the serial number 203 may involve the week of manufacture, a reference number, etc.

The nonvolatile semiconductor memory according to the prior art of FIG. 1 stores a signature involving manufacturer and device codes that have been programmed during production process. When the manufacturer of a semiconductor device differs from the manufacturer who prints device data (device information) on the semiconductor device due to OEM contracts, the data stored in the device will differ from the device data (device information) printed thereon. This results in confusing the market and users.

Semiconductor devices according to the present invention will be explained in detail with reference to FIGS. 3 to 9.

Figure 3:
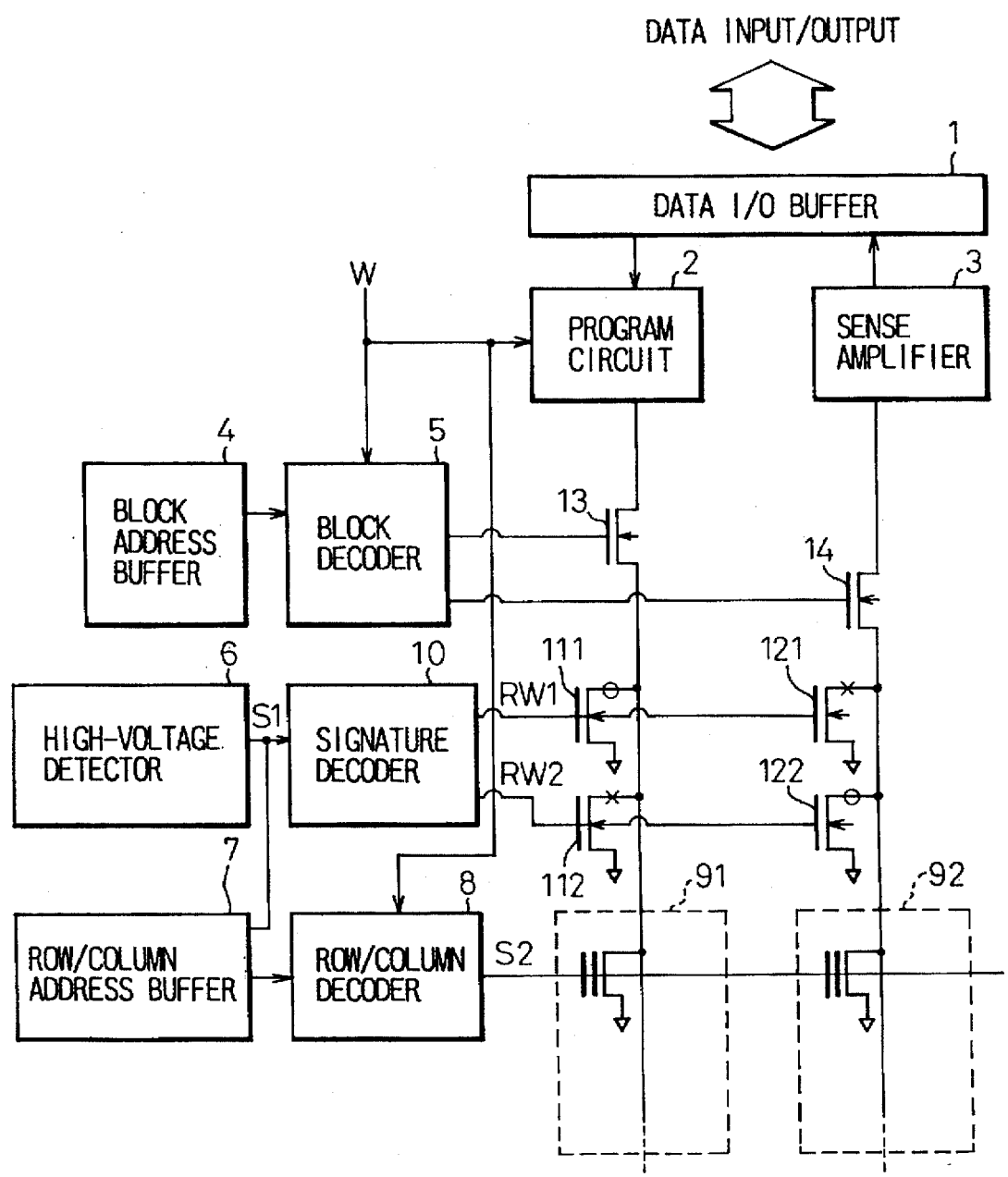
FIG. 3 shows a nonvolatile semiconductor memory according to an embodiment of the present invention.

FIG. 3 shows a nonvolatile semiconductor memory according to an embodiment of the present invention. The memory has plural (two in this embodiment) sets of ROM cells 111 and 121, and 112 and 122, which correspond to the ROM cells 11 and 12 of the prior art of FIG. 1. A signature decoder 10 selects one of the two sets of the ROM cells in response to a high voltage input detected by a high-voltage detector 6. The ROM cells 111, 121, 112, and 122 store device information. These ROM cells may be realized as a part of a memory cell array of the nonvolatile semiconductor memory. The device information may be signatures prepared according to the JEDEC specifications.

In FIG. 3, the nonvolatile semiconductor memory has a data I/O buffer 1, a program circuit 2, a sense amplifier 3, a block address buffer 4, a block decoder 5, the high-voltage detector 6, a row/column address buffer 7, a row/column decoder 8, cell array blocks 91 and 92, the signature decoder 10, the ROM cells 111, 112, 121, and 122, and gate transistors 13 and 14. A program control signal W becomes HIGH when programming data.

One of the first and second cell array blocks 91 and 92 is selected through the gate transistors 13 and 14 in response to a signal from the block decoder 5. The cell array blocks 91 and 92 are connected to the gate transistors 13 and 14, respectively, through bus lines. These bus lines are connected to the two sets of the ROM cells 111 and 121, and 112 and 122, respectively. The ROM cell sets store different signatures, respectively. Each of the signatures may include a manufacturer code and device code.

During chip production processes, pieces (two in this embodiment) of signature data expected according to OEM contracts are programmed in the two sets of the ROM cells 111 and 121, and 112 and 122. For example, in a process of fabricating the ROM cells, the drains of the ROM cells 111 and 122 are connected to the bus line to store data "1," and the drains of the ROM cells 121 and 112 are disconnected from the bus line to store data "0." In this way, the two ROM cell sets are able to store different device information pieces, i.e., signatures such as manufacturer code and device code. In practice, each signature is composed of, for example, two bytes.

In normal operation, the nonvolatile semiconductor memory of this embodiment works similar to the prior art of FIG. 1. Namely, the row/column decoder 8 provides a cell selection signal S2, which selects a cell in each of the first and second cell array blocks 91 and 92. The block decoder 5 chooses one of the selected cells and connects it to the sense amplifier to read data out of the chosen cell.

To read the signature stored in the ROM cells 111 and 121, or 112 and 122, a high-voltage signal is externally applied. The high-voltage detector 6 detects the high-voltage signal and provides a high-voltage detection signal S1 of level HIGH to the signature decoder 10. The signal S1 is also supplied to the row/column address buffer 7, to make the row/column decoder 8 unselected. In response to the high-voltage detection signal S1 of level HIGH, the signature decoder 10 raises a device information selection signal RW1 or RW2 to level HIGH. According to the signal RW1 or RW2 of level HIGH, one of the ROM cell sets storing the signatures, i.e., device information is selected. Which of the device information selection signals RW1 and RW2 is raised to level HIGH is determined after a wafer fabricating step that employs common masks.

As explained above, a nonvolatile semiconductor memory frequently holds a signature that is different from device information (device data) printed on the memory, due to OEM contracts. Even so, the embodiment of the present invention stores a plurality of signatures and selects one that corresponds to the device information printed on the memory. Namely, even if the same semiconductor chips are marketed with different manufacturer information being printed on the chips, the present invention is capable of reading device data that matches the printed information out of each chip, to thereby avoid confusing users.

Figure 4:
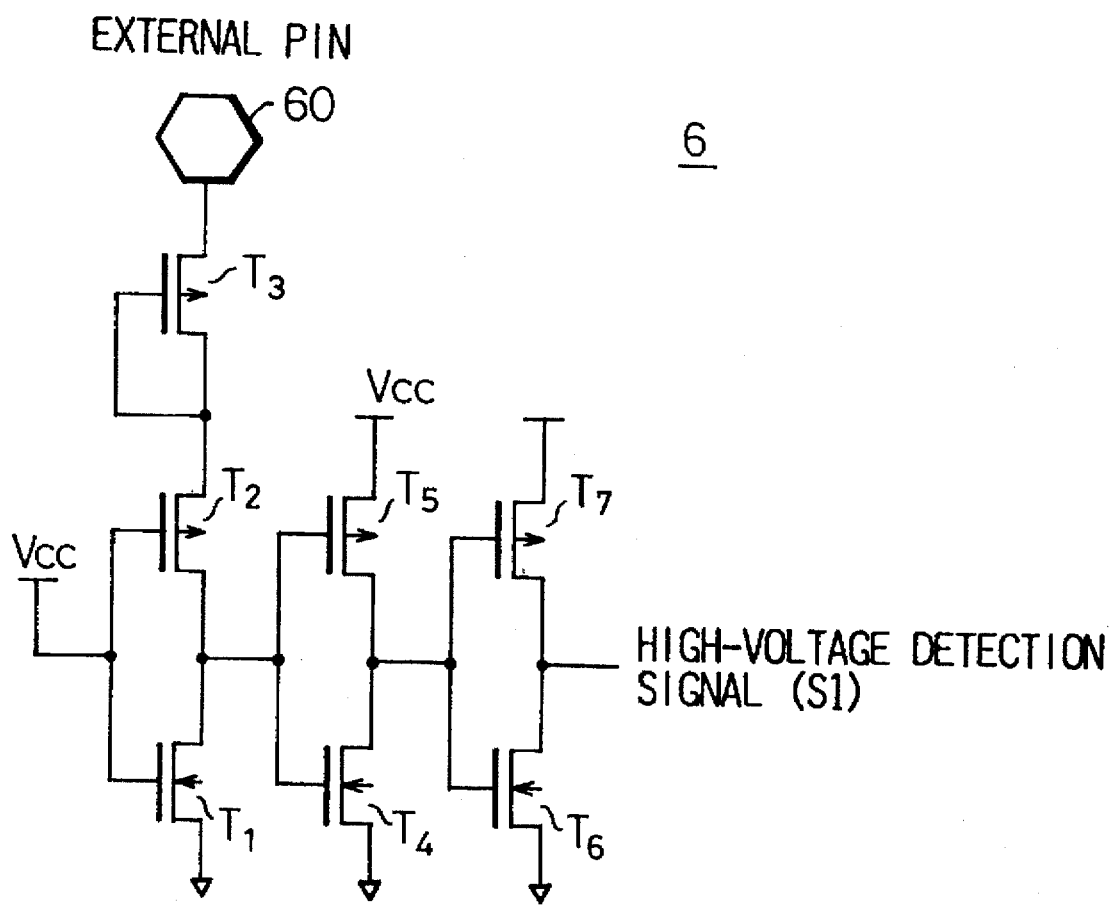
FIG. 4 shows a high-voltage detector disposed in the nonvolatile semiconductor memory of FIG. 3.

FIG. 4 shows an example of the high-voltage detector 6 disposed in the nonvolatile semiconductor memory of FIG. 3.

The high-voltage detector 6 detects a high voltage applied to an external address pin 60 and sets a device information read mode. The high-voltage detector 6 has p-channel MOS transistors T2, T3, T5, and T7 and n-channel MOS transistors T1, T4, and T6. The transistors T4 and T5 form an inverter, and the transistors T6 and T7 also form an inverter. An output of the inverter formed of the transistors T6 and T7 provides the high-voltage detection signal S1.

Under a normal mode, the voltage applied to the external pin 60 is lower than a source voltage Vcc, and therefore, the high-voltage detector 6 sets the detection signal S1 LOW.

When the voltage applied to the external pin 60 exceeds Vcc+Vth(T2)+Vth(T3), i.e., when the input voltage exceeds the sum of the source voltage Vcc and the threshold voltages of the transistors T2 and T3, the detection signal S1 is raised HIGH.

Figure 5:
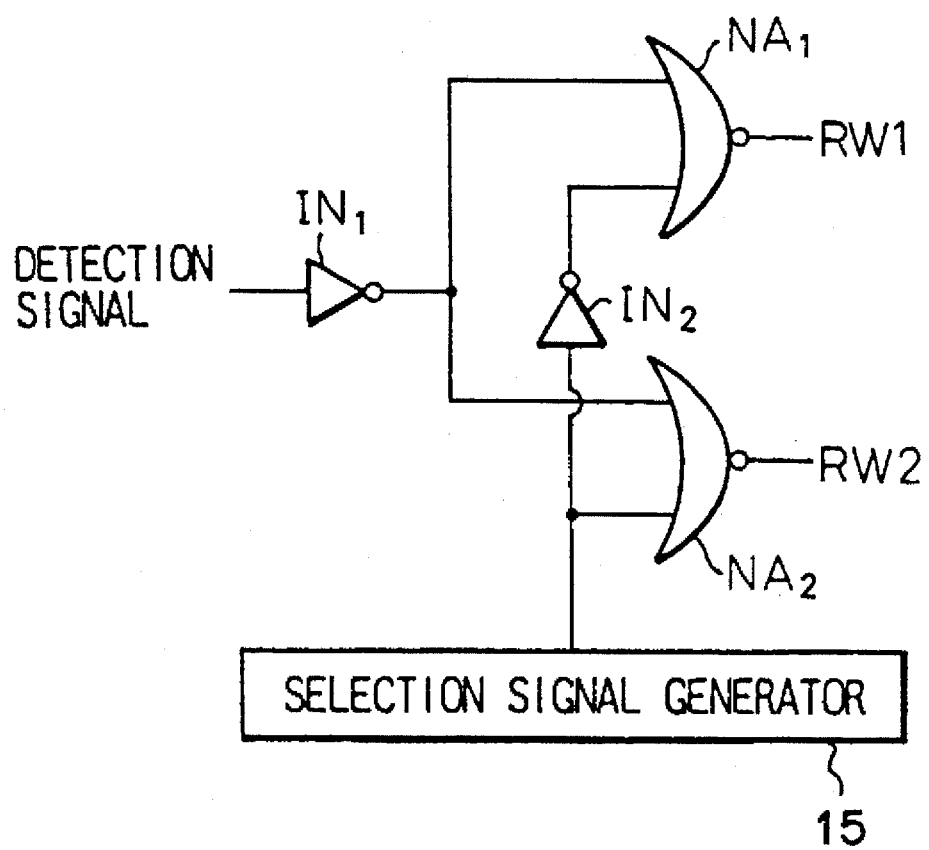
FIG. 5 shows a signature decoder disposed in the nonvolatile semiconductor memory of FIG. 3.

FIG. 5 shows an example of the signature decoder 10 disposed in the nonvolatile semiconductor memory of FIG. 3. The signature decoder 10 has inverters IN1 and IN2, NAND gates NA1 and NA2, and a selection signal generator 15. According to an output level of the selection signal generator 15, one of the device information selection signals RW1 and RW2 is set HIGH to select one of the two sets of the ROM cells 111 and 121, and 112 and 122 that is storing device information corresponding to information printed on the memory.

More precisely, when the selection signal generator 15 provides a HIGH output, only the first device information selection signal RW1 becomes HIGH to select the first set of the ROM cells 111 and 121. When the selection signal generator 15 provides a low output, only the second device information selection signal RW2 becomes HIGH to select the second set of the ROM cells 112 and 122.

Figure 6A:
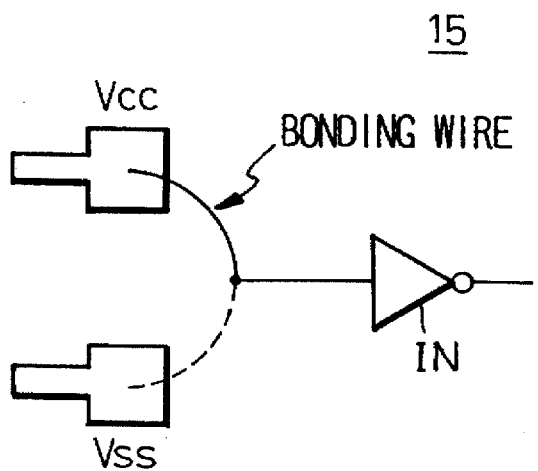
FIGS. 6A to 6C show selection signal generators employable for the signature decoder of FIG. 5.
Figure 6B:
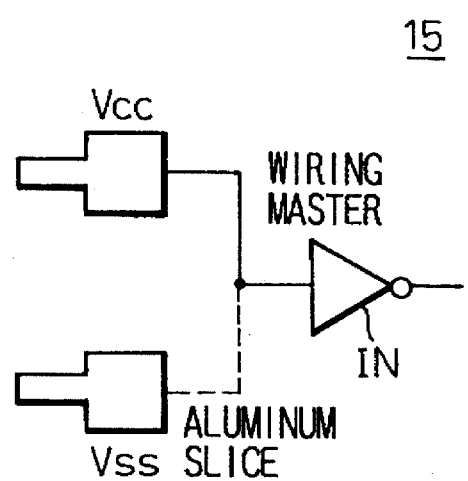
Figure 6C:
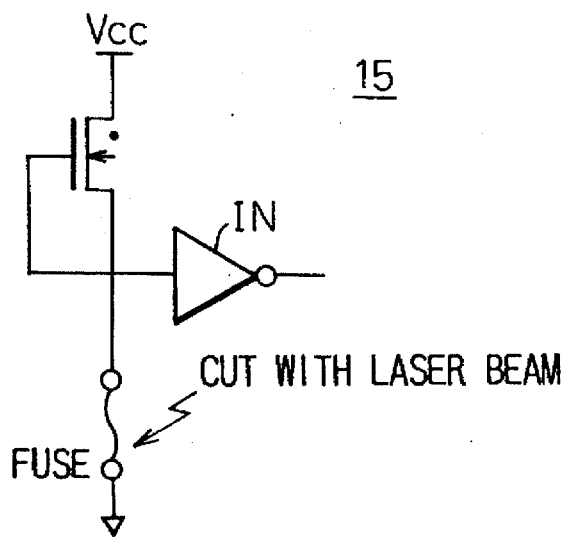

FIGS. 6A to 6C show examples of the selection signal generator 15 of FIG. 5. As explained above, this embodiment selects one of the two sets of the ROM cells, 111 and 121 or 112 and 122, that is storing device information corresponding to the information printed on the memory, according to an output level of the selection signal generator 15. The output of the selection signal generator 15 is determined after the chip production step that employs common masks.

In FIG. 6A, the output of the selection signal generator 15 is determined by the output of an inverter IN, which is determined by optionally forming a bonding wire during the fabrication of the nonvolatile semiconductor memory.

In FIG. 6B, the output level of the selection signal generator 15 is determined by the output of an inverter IN, which is determined by a chip wiring layer on a master slice. More precisely, when the input of the inverter IN is connected to a low source voltage Vss, only the first device information selection signal RW1 becomes HIGH to select the first set of the ROM cells 111 and 121. When the input of the inverter IN is connected to a high source voltage Vcc, only the second device information selection signal RW2 becomes HIGH to select the second set of the ROM cells 112 and 122.

In FIG. 6C, the output of the selection signal generator 15 is determined by the output of an inverter, which determines whether or not a fuse is cut with a laser beam. More precisely, when the fuse is connected, the first set of the ROM cells 111 and 121 is selected, and when the fuse is cut, the second set of the ROM cells 112 and 122 is selected. In place of the fuse to be cut with a laser beam, an electric fuse or a nonvolatile memory cell is employable.

Figure 7:
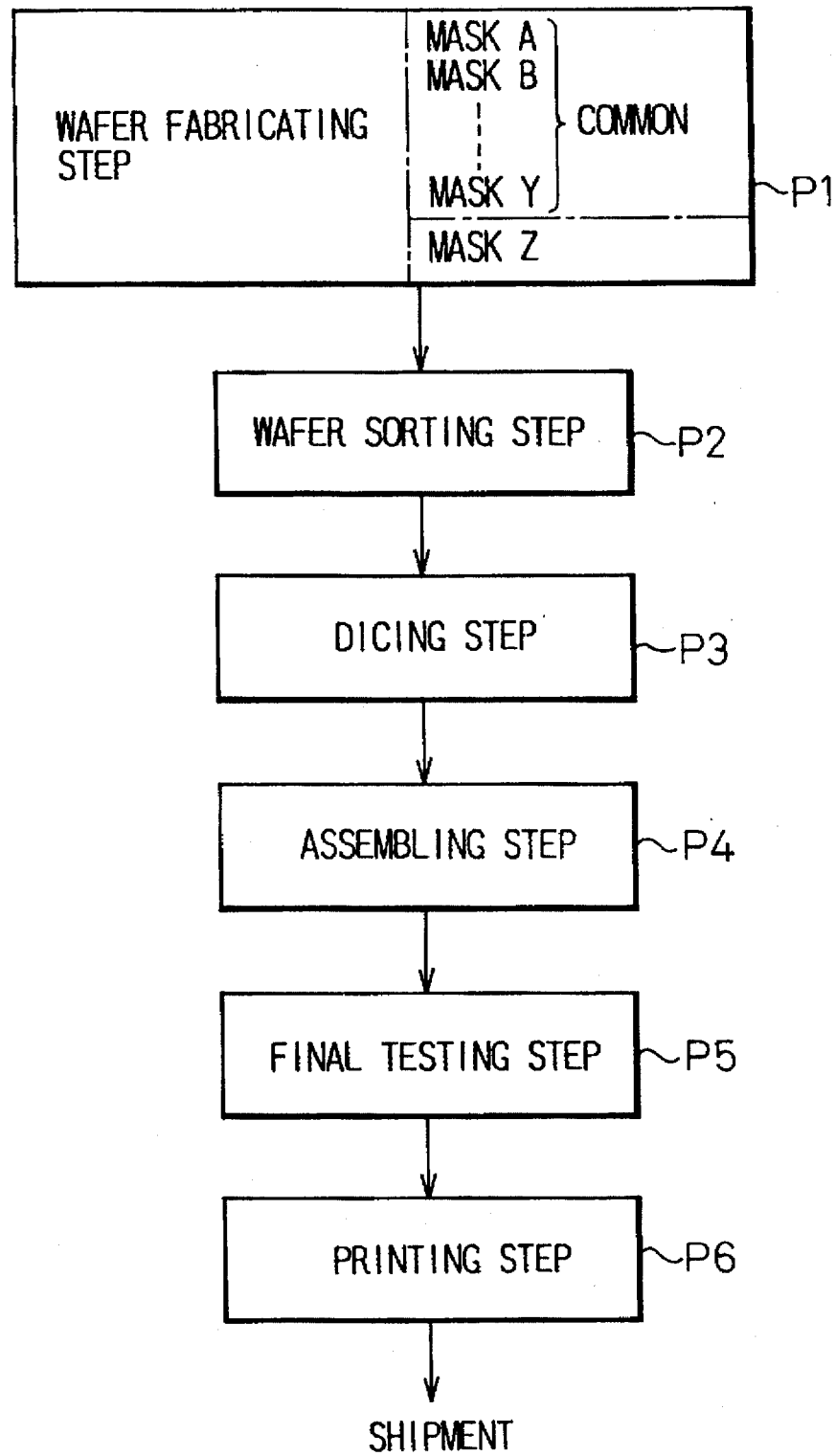
FIG. 7 shows semiconductor production process during which the output level of a selection signal generator is determined.
Figure 8:
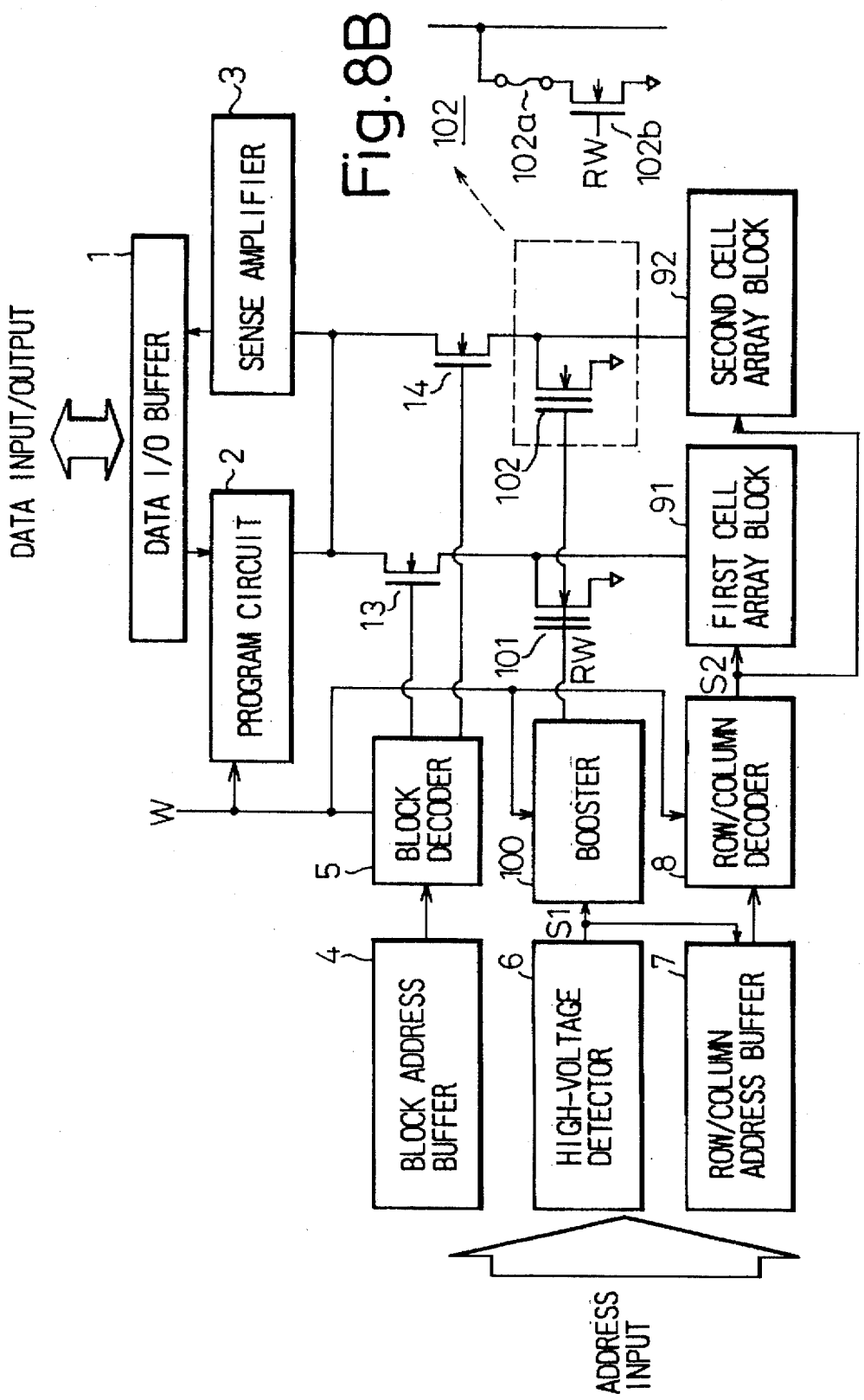
FIGS. 8A and 8B show a nonvolatile semiconductor memory and a modification thereof according to another embodiment of the present invention.

FIG. 7 shows steps of producing a semiconductor device during which the output level of the selection signal generator 15 is determined. The steps include a wafer fabricating step P1, a wafer sorting step P2, a dicing step P3, an assembling step P4, a final testing step P5, and a printing step P6. The output of the selection signal generator 15 in FIGS. 6A to 6C is determined in one of these steps.

The optional bonding wire technique of FIG. 6A is carried out in the assembling step P4 in which a wire bonding process is carried out.

The master slice technique of FIG. 6B is carried out in, for example, the wafer fabricating step P1. The last mask Z in this step is formed according to individual manufacturers. Masks A to Y in this step are independent of the manufacturers and are commonly used for producing semiconductor devices.

The fuse cutting technique of FIG. 6C is carried out in the testing step P2 or P5. The wafer sorting step P2 may cut fuses with a laser beam. The final testing step P5 may cut electric fuses by applying a voltage between predetermined pins of each semiconductor product (semiconductor device). So the wafer sorting step may do.

FIG. 8A shows a nonvolatile semiconductor memory according to another embodiment of the present invention, and FIG. 8B shows a modification of a PROM cell 102 of FIG. 8A. The memory of FIG. 8A employs a booster 100 and PROM cells 101 and 102 instead of the signature decoder 10 and ROM cells 111, 121, 112, and 122 of the embodiment of FIG. 3. The other parts of FIG. 8A are the same as those of FIG. 3.

In FIG. 8A, the booster 100 receives a high-voltage detection signal S1, from the high-voltage detector 6, and a program control signal W, and programs device information corresponding to device information printed on the memory into the PROM cells 101 and 102. This process of programming the device information into the PROM cells 101 and 102 is carried out after a process of printing device information on the memory, so that the device information corresponding to the printed information can be stored in the device. Accordingly, even if the same chips have different manufacturer information printed on the surfaces of the chips, each of the chips may store proper device information corresponding to the printed information. The PROM cells 101 and 102 may be realized as a part of a memory cell array in the nonvolatile semiconductor memory.

FIG. 8B employs a fuse 102a and a cell transistor 102b instead of the PROM cell 102, to store device information. Different information is available depending on whether or not the fuse 102a is disconnected.

Figure 9:
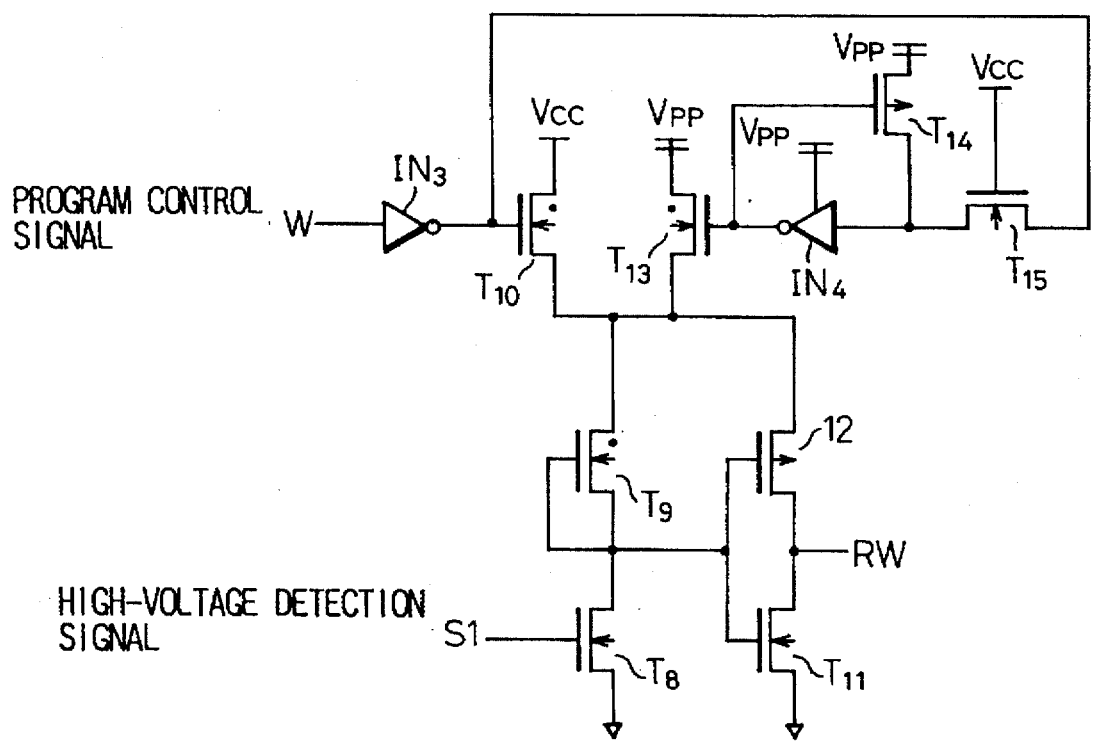
FIG. 9 shows a booster disposed in the nonvolatile semiconductor memory of FIG. 8A.

FIG. 9 shows an example of the booster 100 of FIG. 8A. The booster 100 controls the PROM cells 101 and 102, to program and read device information to and from the PROM cells. The booster 100 has p-channel MOS transistors T12 and T14, n-channel MOS transistors T8, T9, T10, T11, T13, and T15, and inverters IN3 and IN4.

When the high-voltage detection signal S1 from the high-voltage detector 6 is HIGH and the program control signal W is also HIGH, the booster 100 provides a program control signal RW at a voltage Vpp, which is higher than a source voltage Vcc, to program device information corresponding to device information printed on the package of the memory into the PROM cells 101 and 102. When the high-voltage detection signal S1 is HIGH and the program control signal W is LOW, the booster 100 provides a read control signal RW, at the source voltage Vcc, to read the device information out of the PROM cells 101 and 102.

Although the above embodiments relate to nonvolatile semiconductor memories, the present invention is widely applicable for semiconductor devices having functions of storing and reading device information.

As explained above, same semiconductor devices frequently have different manufacturer names, product names, etc., printed thereon. The present invention is capable of matching device information stored in the devices with the information printed on the devices, to thereby avoid confusion of the market and users.

Many different embodiments of the present invention may be constructed without departing from the spirit and scope of the present invention, and it should be understood that the present invention is not limited to the specific embodiments described in this specification, except as defined in the appended claims.

We claim:

1. A semiconductor device having a function of reading device information specific to the device as and when required, said semiconductor device comprising:
    a storage means for storing plural pieces of device information;
    a selection signal generation means for generating a selection signal where selection information indicating specific device information to be selected is programmed; and
    a selection means for selecting a predetermined one of the information pieces stored in said storage means in accordance with the selection signal generated by said selection signal generation means when a device information read mode is set so that the selected and read device information is matched with device data indicating said semiconductor device.

2. A semiconductor device as claimed in claim 1, wherein said selection means selects one of the information pieces according to at least one bonding wire.

3. A semiconductor device as claimed in claim 2, wherein said bonding wire is optionally prepared in an assembling step of assembling said semiconductor device.

4. A semiconductor device as claimed in claim 1, wherein said selection means selects one of the information pieces by use of at least one fuse.

5. A semiconductor device as claimed in claim 4, wherein said fuse is cut by using a laser beam in a wafer testing step of testing a wafer.

6. A semiconductor device as claimed in claim 4, wherein said fuse is cut by applying a voltage between predetermined pins of said semiconductor device in a wafer sorting step or in a final testing step of testing a semiconductor product.

7. A semiconductor device as claimed in claim 1, wherein said selection means selects one of the information pieces by use of at least one nonvolatile memory transistor.

8. A semiconductor device as claimed in claim 1, wherein said selection means selects one of the information pieces according to at least one mask on a master slice in a wafer fabricating step.

9. A semiconductor device as claimed in claim 8, wherein said mask is used as the last mask in said wafer fabricating step.

10. A semiconductor device as claimed in claim 1, wherein said semiconductor device is a nonvolatile semiconductor memory, and said storage means is a part of a memory cell array in said nonvolatile semiconductor memory.

11. A semiconductor device as claimed in claim 10, wherein said nonvolatile semiconductor memory has first memory cell array, first decoder for selecting bit and word lines connected to said first memory cell array, a storage means involving second memory cell arrays for storing the device information pieces, and a second decoder for selecting one word line connected to said second memory cell array when said device information read mode is set.

12. A semiconductor device as claimed in claim 1, wherein the device information includes manufacturer code and device code.

13. A semiconductor device as claimed in claim 1, wherein said semiconductor device further comprises a high-voltage detector serving as an information read mode setting means that sets the information read mode only when a voltage higher than a normal source voltage is externally provided.

14. A semiconductor device as claimed in claim 1, wherein the device data indicating said semiconductor device includes a manufacturer logo, and a part name.

15. A semiconductor device having a function of reading device information specific to the device as and when required, said semiconductor device comprising:
    a storage means for storing plural pieces of device information; and
    a selection means for selecting a predetermined one of the information pieces stored in said storage means when a device information read mode is set so that the selected and read device information is matched with device data indicating said semiconductor device,
    wherein said selection means selects one of the information pieces according to at least one bonding wire, and
    wherein said bonding wire is optionally prepared in an assembling step of assembling said semiconductor device.

16. A semiconductor device having a function of reading device information specific to the device as and when required, said semiconductor device comprising:
    a storage means for storing plural pieces of device information; and
    a selection means for selecting a predetermined one of the information pieces stored in said storage means when a device information read mode is set so that the selected and read device information is matched with device data indicating said semiconductor device,
    wherein said selection means selects one of the information pieces with the use of at least one fuse.

17. A semiconductor device as claimed in claim 16, wherein said fuse is cut by using a laser beam in a wafer testing step of testing a wafer.

18. A semiconductor device as claimed in claim 16, wherein said fuse is cut by applying a voltage between predetermined pins of said semiconductor device in one of a wafer sorting step and a final testing step of testing a semiconductor product.

19. A semiconductor device having a function of reading device information specific to the device as and when required, said semiconductor device comprising:

a storage means for storing plural pieces of device information; and a selection means for selecting a predetermined one of the information pieces stored in said storage means when a device information read mode is set so that the selected and read device information is matched with device data indicating said semiconductor device, wherein said selection means selects one of the information pieces according to at least one mask on a master slice in a wafer fabricating step.

20. A semiconductor device as claimed in claim 19, wherein said mask is used as a last mask in said wafer fabricating step.

21. A semiconductor device having a function of reading device information specific to the device as and when required, said semiconductor device comprising:

a storage means for storing plural pieces of device information; and a selection means for selecting a predetermined one of the information pieces stored in said storage means when a device information read mode is set so that the selected and read device information is matched with device data indicating said semiconductor device, wherein said semiconductor device further comprises a high-voltage detector serving as an information read mode setting means that sets the information read mode only when a voltage higher than a normal source voltage is externally provided.

* * * * *